United States Patent
Brosnan

(10) Patent No.: US 10,584,266 B2
(45) Date of Patent: Mar. 10, 2020

(54) CMP COMPOSITIONS CONTAINING POLYMER COMPLEXES AND AGENTS FOR STI APPLICATIONS

(71) Applicant: Cabot Microelectronics Corporation, Aurora, IL (US)

(72) Inventor: Sarah Brosnan, St. Charles, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/920,813

(22) Filed: Mar. 14, 2018

(65) Prior Publication Data

US 2019/0284434 A1 Sep. 19, 2019

(51) Int. Cl.
| | |
|---|---|
| *C09G 1/02* | (2006.01) |
| *B24B 37/04* | (2012.01) |
| *H01L 21/3105* | (2006.01) |
| *H01L 21/306* | (2006.01) |
| *H01L 21/762* | (2006.01) |

(52) U.S. Cl.
CPC .............. *C09G 1/02* (2013.01); *B24B 37/044* (2013.01); *H01L 21/30625* (2013.01); *H01L 21/31053* (2013.01); *H01L 21/31055* (2013.01); *H01L 21/76224* (2013.01)

(58) Field of Classification Search
CPC ................ C09G 1/02; H01L 21/30625; H01L 21/31055; H01L 21/76224; H01L 21/31053; B24B 37/044
See application file for complete search history.

(56) References Cited

U.S. PATENT DOCUMENTS

| | | |
|---|---|---|
| 7,071,105 B2 | 7/2006 | Carter et al. |
| 9,279,067 B2 | 3/2016 | Reiss |
| 9,281,210 B2 | 3/2016 | Reiss et al. |
| 9,597,768 B1 | 3/2017 | Pandey et al. |
| 2006/0021972 A1 | 2/2006 | Lane et al. |
| 2006/0144824 A1 | 7/2006 | Carter et al. |
| 2011/0207326 A1* | 8/2011 | Kim .......................... C09G 1/02 438/693 |
| 2011/0258938 A1* | 10/2011 | Morinaga ................ B24D 3/00 51/309 |
| 2015/0102012 A1* | 4/2015 | Reiss ....................... C09G 1/02 216/89 |
| 2016/0257853 A1* | 9/2016 | Reiss ................ H01L 21/30625 |
| 2016/0257856 A1* | 9/2016 | Reiss ........................ B24B 1/00 |
| 2017/0066102 A1* | 3/2017 | Pandey ................. B24B 37/044 |
| 2017/0088748 A1* | 3/2017 | Stender ............ H01L 21/31053 |
| 2017/0183538 A1 | 6/2017 | Kwon et al. |
| 2018/0105721 A1* | 4/2018 | Pallikkara Kuttiatoor .................. C09G 1/02 |
| 2018/0244956 A1* | 8/2018 | Hains ................ H01L 21/31053 |

FOREIGN PATENT DOCUMENTS

| | | |
|---|---|---|
| KR | 1020170045672 A | 4/2017 |
| WO | 2015088871 A1 | 6/2015 |
| WO | 2017011451 A1 | 1/2017 |

OTHER PUBLICATIONS

Korean Intellectual Property Office as ISA, Search Report and Written Opinion of the International Searching Authority issued in connection with Application No. PCT/US2019/020647 dated Jun. 18, 2019.

* cited by examiner

*Primary Examiner* — Anita K Alanko
(74) *Attorney, Agent, or Firm* — Thomas Omholt; Erika S. Wilson; Derek W. Barnett

(57) ABSTRACT

The invention relates to a chemical-mechanical polishing composition comprising (a) ceria abrasive particles, (b) a cationic polymer, (c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof, (d) a saturated monoacid, and (e) an aqueous carrier. The invention also relates to a method of polishing a substrate.

14 Claims, No Drawings

CMP COMPOSITIONS CONTAINING POLYMER COMPLEXES AND AGENTS FOR STI APPLICATIONS

BACKGROUND OF THE INVENTION

Compositions and methods for planarizing or polishing the surface of a substrate are well known in the art. Polishing compositions (also known as polishing slurries) typically contain an abrasive material in a liquid carrier (e.g., aqueous carrier) and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

As a method for isolating elements of a semiconductor device, a great deal of attention is being directed towards a shallow trench isolation (STI) process where a silicon nitride (SiN) layer is formed on a silicon substrate, shallow trenches are formed via etching or photolithography, and a dielectric layer (e.g., an oxide) is deposited to fill the trenches. Due to variation in the depth of trenches, or lines, formed in this manner, it is typically necessary to deposit an excess of dielectric material on top of the substrate to ensure complete filling of all trenches. The excess dielectric material is then typically removed by a chemical-mechanical planarization process to expose the silicon nitride layer. When the silicon nitride layer is exposed, the largest area of the substrate exposed to the chemical-mechanical polishing composition comprises silicon nitride, which must then be polished to achieve a highly planar and uniform surface. Typically, it is desirable to emphasize selectivity for oxide polishing in preference to silicon nitride polishing. Thus, the silicon nitride layer serves as a stopping layer during the chemical-mechanical planarization process, as the overall polishing rate decreases upon exposure of the silicon nitride layer.

The STI substrate is typically polished using a conventional polishing medium and an abrasive-containing polishing composition. However, polishing STI substrates with conventional polishing media and abrasive-containing polishing compositions has been observed to result in overpolishing of the substrate surface or the formation of recesses in the STI features and other topographical defects such as microscratches on the substrate surface. This phenomenon of overpolishing and forming recesses in the STI features is referred to as dishing. Dishing is undesirable because dishing of substrate features may detrimentally affect device fabrication by causing failure of isolation of transistors and transistor components from one another, thereby resulting in short-circuits. Additionally, overpolishing of the substrate may also result in other undesirable effects such as, for example, erosion, SiN loss, oxide loss and exposure of the underlying oxide to damage from polishing or chemical activity, which detrimentally affects device quality and performance.

In addition, a number of existing polishing compositions, particularly containing ceria abrasives, exhibit a limited ability to be concentrated due to instability of the polishing compositions above a certain concentration, leading to settling out of abrasive components. The instability of concentrated polishing compositions thus requires production of more diluted polishing compositions, which increases the volume of material that must be shipped and stored.

Thus, there remains a need in the art for polishing compositions and methods that can provide desirable selectivity of silicon oxide to silicon nitride that have suitable removal rates, low defectivity, low SiN loss, low erosion, and suitable dishing performance, while further exhibiting enhanced dispersion stability.

BRIEF SUMMARY OF THE INVENTION

The invention provides a chemical-mechanical polishing composition comprising (a) ceria abrasive particles, (b) a cationic polymer, (c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof, (d) a saturated monoacid, and (e) an aqueous carrier.

The invention also provides a method of chemically-mechanically polishing a substrate comprising (i) providing a substrate comprising a dielectric layer on a surface of the substrate; (ii) providing a polishing pad; (iii) providing a chemical-mechanical polishing composition comprising (a) ceria abrasive particles, (b) a cationic polymer, (c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof, (d) a saturated monoacid, and (e) an aqueous carrier; (iv) contacting the substrate with the polishing pad and the chemical-mechanical polishing composition; and (v) moving the polishing pad and the chemical-mechanical polishing composition relative to the substrate to abrade at least a portion of the dielectric layer on a surface of the substrate.

DETAILED DESCRIPTION OF THE INVENTION

The invention provides a chemical-mechanical polishing composition comprising, consisting essentially of, or consisting of (a) ceria abrasive particles, (b) a cationic polymer, (c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof, (d) a saturated monoacid, and (e) an aqueous carrier.

The chemical-mechanical polishing composition comprises ceria abrasive particles. As is well known, ceria is an oxide of the rare earth metal cerium, and is also known as ceric oxide, cerium oxide (e.g., cerium(IV) oxide), or cerium dioxide. Cerium(IV) oxide ($CeO_2$) can be formed by calcining cerium oxalate or cerium hydroxide. Cerium also forms cerium(III) oxides such as, for example, $Ce_2O_3$. The ceria abrasive particles can comprise any one or more of these or other oxides of ceria.

The ceria abrasive particles can be of any suitable type. In an embodiment, the ceria abrasive particles comprise, consist essentially of, or consist of calcined ceria particles, wet ceria particles, wet-based process ceria particles or a combination thereof. In a preferred embodiment, the ceria abrasive particles comprise wet ceria particles or wet process-based ceria particles.

As used herein, "wet ceria particles" or "wet process-based ceria particles" (collectively herein "wet process" ceria particles) refers to a ceria prepared by a precipitation, condensation-polymerization, or similar process (as opposed to, for example, fumed or pyrogenic ceria). Without wishing to be bound to a particular theory, it is believed that wet process ceria comprises approximately spherical ceria particles and/or smaller aggregate ceria particles, thereby resulting in lower substrate defectivity when used in the inventive method. An illustrative wet process ceria is HC60™ ceria commercially available from Rhodia.

The ceria abrasive particles can have any suitable average size (i.e., average particle diameter). If the average ceria abrasive particle size is too small, the polishing composition may not exhibit sufficient removal rate. In contrast, if the average ceria abrasive particle size is too large, the polishing composition may exhibit undesirable polishing performance such as, for example, poor substrate defectivity. Accordingly, the ceria abrasive particles can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the ceria abrasive particles can have an average particle size of about 1,000 nm or less, for example, about 750 nm or less, about 500 nm or less, about 250 nm or less, about 150 nm or less, about 100 nm or less, about 75 nm or less, or about 50 nm or less. Thus, the ceria abrasive particles can have an average particle size bounded by any two of the aforementioned endpoints. For example, the ceria abrasive particles can have an average particle size of about 10 nm to about 1,000 nm, e.g., about 10 nm to about 750 nm, about 15 nm to about 500 nm, about 20 nm to about 250 nm, about 20 nm to about 150 nm, about 25 nm to about 150 nm, about 25 nm to about 100 nm, about 50 nm to about 150 nm, or about 50 nm to about 100 nm. For spherical ceria abrasive particles, the size of the particle is the diameter of the particle. For non-spherical ceria particles, the size of the particle is the diameter of the smallest sphere that encompasses the particle. The particle size of the ceria abrasive particles can be measured using any suitable technique, for example, using laser diffraction techniques. Suitable particle size measurement instruments are available from, for example, Malvern Instruments (Malvern, UK).

In some embodiments, the ceria abrasive particles of the polishing composition exhibit a multimodal particle size distribution. As used herein, the term "multimodal" means that the ceria abrasive particles exhibit an average particle size distribution having at least 2 maxima (e.g., 2 or more maxima, 3 or more maxima, 4 or more maxima, or 5 or more maxima). Preferably, in these embodiments, the ceria abrasive particles exhibit a bimodal particle size distribution, i.e., the ceria abrasive particles exhibit a particle size distribution having 2 average particle size maxima. The terms "maximum" and "maxima" mean a peak or peaks in the particle size distribution. The peak or peaks correspond to the average particle sizes described herein for the ceria abrasive particles. Thus, for example, a plot of the number of particles versus particle size will reflect a bimodal particle size distribution, with a first peak in the particle size range of about 75 nm to about 150 nm (for example, about 80 nm to about 140 nm, about 85 nm to about 130 nm, or about 90 nm to about 120 nm), and a second peak in the particle size range of about 25 nm to about 70 nm (for example, about 30 nm to about 65 nm, about 35 nm to about 65 nm, or about 40 nm to about 60 nm). The ceria abrasive particles having a multimodal particle size distribution can be obtained by combining two different types of ceria abrasive particles each having a monomodal particle size distribution.

The ceria abrasive particles preferably are colloidally stable in the inventive polishing composition. The term colloid refers to the suspension of ceria abrasive particles in the aqueous carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition can comprise any suitable concentration of ceria abrasive particles. If the polishing composition of the invention comprises too little ceria abrasive particles, the composition may not exhibit a sufficient removal rate. In contrast, if the polishing composition comprises too many ceria abrasive particles, then the polishing composition may exhibit undesirable polishing performance and/or may not be cost effective and/or may lack stability. The ceria abrasive particles can be present in the polishing composition at a concentration of about 10 wt. % or less, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less. Alternatively, or in addition, the ceria abrasive particles can be present in the polishing composition at a concentration of about 0.0005 wt. % or more, for example, about 0.001 wt. % or more, about 0.005 wt. % or more, about 0.01 wt. % or more, about 0.05 wt. % or more, or about 0.1 wt. % or more. Thus, the ceria abrasive particles can be present in the polishing composition at a concentration bounded by any two of the aforementioned endpoints. For example, the ceria abrasive particles can be present in the polishing composition at a concentration of about 0.0005 wt. % to about 10 wt. %, for example, 0.001 wt. % to about 9 wt. %, about 0.005 wt. % to about 8 wt. %, about 0.01 wt. % to about 7 wt. %, about 0.05 wt. % to about 6 wt. %, about 0.1 wt. % to about 5 wt. %, about 0.5 wt. % to about 4 wt. %, about 1 wt. % to about 3 wt. %, or about 1.5 wt. % to about 2.5 wt. %. In an embodiment, the ceria abrasive particles can be present in the polishing composition at a concentration of about 0.2 wt. % to about 0.6 wt. % (e.g., about 0.4 wt. %). In another embodiment, the polishing composition comprises, as a concentrate, about 1-3 wt. % (e.g., about 1.2 wt. % or about 1.6 wt. %) of ceria abrasive particles.

The polishing composition comprises one or more cationic polymers. As used herein, the term "cationic polymer" includes cationic co-polymers. Nonlimiting examples of suitable cationic polymers include cationic polymers comprising poly(diallyldimethylammonium chloride)-co-poly(acrylamide), poly(2-dimethylamino)ethyl methacrylate) methyl chloride quaternary salt, poly(diallyldimethylammonium chloride), polyvinylmethyl imidazolium methyl sulfate, poly(dimethylamine-co-epichlorohydrin), poly(vinylmethyl imidazolium methyl sulfate)-co-poly(vinylpyrrolidone), poly(vinylmethyl imidazolium chloride)-co-poly(N-vinylpyrrolidone), poly(vinylpyrrolidone)-co-poly(methacrylamide)-co-poly(vinylimidazole)-co-poly(vinylmethyl imidazolium methyl sulfate), poly(vinylpyrrolidone)-co-poly(dimethylaminoethyl methacrylate methyl sulfate), poly(vinylcaprolactam)-co-poly(vinylpyrrolidone)-co-poly(vinylmethyl imidazolium methyl sulfate), or a combination thereof. It will be understood that the cationic polymer typically contains two or more quaternary ammonium groups as the cationic polymer comprises two or more monomer units bearing quaternary ammonium groups.

Without wishing to be bound to any particular theory, it is believed that the cationic polymer improves the dishing and erosion performance of the polishing composition thereby acting as a dishing control agent, particularly in combination with the other components of the inventive compositions (e.g., nonionic polymer, saturated monoacid, and unsaturated monoacid, if present). It is believed that the cationic polymer is attracted to the negatively charged oxide surface during polishing and also attracted to oxide/ceria waste products to sequester these charged species, thereby providing good dishing protection. Conventional polishing compositions containing non-cationic polymers/copolymers (e.g., polymers or copolymers comprising polyvinyl alcohol derivatives) can exhibit suitable performance on large features (greater than 50 μm) but exhibit lower performance on small features (less than 200 nm). Polishing compositions of the invention, by contrast, exhibit suitable performance on both large and small features.

The cationic polymer can have any suitable molecular weight. The cationic polymer can have an average molecular weight of about 200 g/mol or more, for example, about 250 g/mol or more, about 300 g/mol or more, about 400 g/mol or more, about 500 g/mol or more, about 600 g/mol or more, about 750 g/mol or more, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4,500 g/mol or more, about 5,000 g/mol or more, about 5,500 g/mol or more, about 6,000 g/mol or more, about 6,500 g/mol or more, about 7,000 g/mol or more, about 7,500 g/mol or more, about 10,000 g/mol or more, about 15,000 g/mol or more, about 20,000 g/mol or more, about 25,000 g/mol or more, about 30,000 g/mol or more, about 35,000 g/mol or more, about 40,000 g/mol or more, about 45,000 g/mol or more, about 50,000 g/mol or more, about 75,000 g/mol or more, about 100,000 g/mol or more, about 125,000 g/mol or more, about 150,000 g/mol or more, about 175,000 g/mol or more, about 200,000 g/mol or more, about 225,000 g/mol or more, about 250,000 g/mol or more, about 275,000 g/mol or more, about 300,000 g/mol or more, about 325,000 g/mol or more, about 350,000 g/mol or more, about 375,000 g/mol or more, about 400,000 g/mol or more, about 425,000 g/mol or more, about 450,000 g/mol or more, about 475,000 g/mol or more, or about 500,000 g/mol or more. Alternatively, or in addition, the cationic polymer can have an average molecular weight of about 1,000,000 g/mol or less, about 975,000 g/mol or less, about 950,000 g/mol or less, about 925,000 g/mol or less, about 900,000 g/mol or less, about 875,000 g/mol or less, about 850,000 g/mol or less, about 825,000 g/mol or less, about 800,000 g/mol or less, about 775,000 g/mol or less, about 750,000 g/mol or less, about 725,000 g/mol or less, about 700,000 g/mol or less, about 675,000 g/mol or less, about 650,000 g/mol or less, about 625,000 g/mol or less, about 600,000 g/mol or less, about 575,000 g/mol or less, about 550,000 g/mol or less, or about 525,000 g/mol or less. Thus, the cationic polymer can have an average molecular weight bounded by any two of the aforementioned endpoints. For example, the cationic polymer can have an average molecular weight of about 200 g/mol to about 1,000,000 g/mol, about 250 g/mol to about 975,000 g/mol, about 300 g/mol to about 950,000 g/mol, about 400 g/mol to about 925,000 g/mol, about 500 g/mol to about 900,000 g/mol, about 600 g/mol to about 875,000 g/mol, about 750 g/mol to about 850,000 g/mol, about 1,000 g/mol to about 825,000 g/mol, about 1,500 g/mol to about 800,000 g/mol, about 2,000 g/mol to about 775,000 g/mol, about 2,500 g/mol to about 750,000 g/mol, about 3,000 g/mol to about 725,000 g/mol, about 3,500 g/mol to about 700,000 g/mol, about 4,000 g/mol to about 675,000, about 4,500 g/mol to about 650,000 g/mol, about 5,000 g/mol to about 625,000 g/mol, about 5,500 g/mol to about 650,000, about 6,000 g/mol to about 625,000 g/mol, about 6,500 g/mol to about 600,000 g/mol, about 7,000 g/mol to about 575,000 g/mol, about 7,500 g/mol to about 550,000 g/mol, about 10,000 g/mol to about 525,000 g/mol, about 15,000 g/mol to about 500,000 g/mol, about 20,000 g/mol to about 475,000 g/mol, about 25,000 g/mol to about 450,000 g/mol, about 30,000 g/mol to about 425,000 g/mol, about 35,000 g/mol to about 400,000 g/mol, about 40,000 g/mol to about 375,000, about 45,000 g/mol to about 350,000 g/mol, about 50,000 g/mol to about 325,000 g/mol, about 75,000 g/mol about 300,000 g/mol, about 100,000 g/mol to about 275,000 g/mol, about 125,000 to about 250,000 g/mol, about 150,000 g/mol to about 225,000 g/mol, or about 175,000 to about 200,000 g/mol.

The cationic polymer can be present in the polishing composition in any suitable concentration. The concentration of cationic polymer refers to the total amount of cationic polymer present in the polishing composition. The cationic polymer can be present in the polishing composition at a concentration of about 5 ppm or more, for example, about 10 ppm or more, about 15 ppm or more, about 20 ppm or more, about 25 ppm or more, about 30 ppm or more, about 35 ppm or more, about 40 ppm or more, about 45 ppm or more, about 50 ppm or more, about 55 ppm or more, about 60 ppm or more, about 65 ppm or more, about 70 ppm or more, about 75 ppm or more, about 80 ppm or more, about 85 ppm or more, about 90 ppm or more, about 95 ppm or more, about 100 ppm or more, about 105 ppm or more, about 110 ppm or more, about 115 ppm or more, about 120 or more, about 125 ppm or more, about 130 ppm or more, about 135 ppm or more, about 140 ppm or more, about 145 ppm or more, or about 150 ppm or more. Alternatively, or in addition, the cationic polymer can be present in the polishing composition at a concentration of about 250 ppm or less, for example, about 245 ppm or less, about 240 ppm or less, about 235 ppm or less, about 230 ppm or less, about 225 ppm or less, about 220 ppm or less, about 215 ppm or less, about 210 ppm or less, about 205 ppm or less, about 200 ppm or less, about 195 ppm or less, about 190 ppm or less, about 185 ppm or less, about 180 ppm or less, about 175 ppm or less, about 170 ppm or less, about 165 ppm or less, about 160 ppm or less, or about 155 ppm or less. Thus, the cationic polymer can be present in the polishing composition at a concentration bounded by any two of the aforementioned endpoints. For example, the cationic polymer can be present in the polishing composition at a concentration of about 5 ppm to about 250 ppm, about 10 ppm to about 245 ppm, about 15 ppm to about 240 ppm, about 20 ppm to about 235 ppm, about 25 ppm to about 230 ppm, about 30 ppm to about 225 ppm, about 35 ppm to about 220 ppm, about 40 ppm to about 215 ppm, about 45 ppm to about 210 ppm, about 50 ppm to about 205 ppm, about 55 ppm to about 200 ppm, about 60 ppm to about 195 ppm, about 65 ppm to about 190 ppm, about 70 ppm to about 185 ppm, about 75 ppm to about 180 ppm, about 80 ppm to about 175 ppm, about 85 ppm to about 170 ppm, about 90 ppm to about 165 ppm, about 95 ppm to about 160 ppm, about 100 ppm to about 155 ppm, about 105 ppm to about 150 ppm, about 110 ppm to about 145 ppm, about 115 ppm to about 140 ppm, about 120 ppm to about 135 ppm, or about 125 ppm to about 130 ppm.

In an embodiment, the cationic polymer is present in the polishing composition at a concentration of about 5 ppm to about 250 ppm. In another embodiment, the cationic polymer is present in the polishing composition at a concentration of about 10 ppm to about 100 ppm. In yet another embodiment, the cationic polymer is present in the polishing composition at a concentration of about 35 ppm to about 60 ppm.

Unless otherwise stated, the units expressed as ppm herein are intended to reflect a weight ratio of the component to the total weight of the composition. So, for example, the terms 1000 ppm and 0.1 wt. % would be interchangeable.

The polishing composition comprises a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof. Without wishing to be bound to any particular theory, the nonionic polymer works in conjunction with the cationic polymer to improve the polishing performance (e.g., helps to maintain suitable removal rate during polishing and profile performance).

The nonionic polymer can have any suitable molecular weight. The nonionic polymer can have an average molecular weight of about 250 g/mol or more, for example, about 300 g/mol or more, about 400 g/mol or more, about 500 g/mol or more, about 600 g/mol or more, about 750 g/mol or more, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4,500 g/mol or more, about 5,000 g/mol or more, about 5,500 g/mol or more, about 6,000 g/mol or more, about 6,500 g/mol or more, about 7,000 g/mol or more, or about 7,500 g/mol or more. Alternatively, or in addition, the nonionic polymer can have an average molecular weight of about 50,000 g/mol or less, for example, about 45,000 g/mol or less, about 40,000 g/mol or less, about 35,000 g/mol or less, about 30,000 g/mol or less, about 25,000 g/mol or less, about 20,000 g/mol or less, about 15,000 g/mol or less, or about 10,000 g/mol or less. Thus, the nonionic polymer can have an average molecular weight bounded by any two of the aforementioned endpoints. For example, the nonionic polymer can have an average molecular weight of about 250 g/mol to about 50,000 g/mol, about 250 g/mol to about 45,000 g/mol, about 250 g/mol to about 40,000 g/mol, about 250 g/mol to about 35,000 g/mol, about 1,000 g/mol to about 30,000 g/mol, about 1,000 g/mol to about 25,000 g/mol, about 1,000 g/mol to about 20,000 g/mol, about 2,000 g/mol to about 15,000 g/mol, about 3,000 g/mol to about 10,000 g/mol, about 7,500 g/mol to about 50,000 g/mol, about 7,500 g/mol to about 40,000 g/mol, or about 7,500 g/mol to about 35,000 g/mol.

The polishing composition comprises any suitable amount of the nonionic polymer. The concentration of nonionic polymer refers the total amount of nonionic polymer present in the polishing composition. The nonionic polymer can be present in the polishing composition at a concentration of about 1 ppm or more, for example, about 5 ppm or more, about 10 ppm or more, about 20 ppm or more, about 30 ppm or more, about 40 ppm or more, about 50 ppm or more, about 75 ppm or more, about 100 ppm or more, about 125 ppm or more, about 150 ppm or more, about 175 ppm or more, about 200 ppm or more, about 250 ppm or more, about 300 ppm or more, about 350 ppm or more, about 400 ppm or more, about 450 ppm or more, about 500 ppm or more, about 550 ppm or more, about 600 ppm or more, about 650 ppm or more, about 700 ppm or more, about 750 ppm or more, about 800 ppm or more, about 850 ppm or more, about 900 ppm or more, about 950 ppm or more, about 1000 ppm or more, about 1250 ppm or more, about 1500 ppm or more, about 1750 ppm or more, about 2000 ppm or more, about 2250 ppm or more, about 2500 ppm or more, about 2750 ppm or more, or about 3000 ppm or more. Alternatively, or in addition, the nonionic polymer can be present in the polishing composition at a concentration of about 5000 ppm or less, for example, about 4900 ppm or less, about 4800 ppm or less, about 4700 ppm or less, about 4600 ppm or less, about 4500 ppm or less, about 4400 ppm or less, about 4300 ppm or less, about 4200 ppm or less, about 4100 ppm or less, about 4000 ppm or less, about 3900 ppm or less, about 3800 ppm or less, about 3700 ppm or less, about 3600 ppm or less, about 3500 ppm or less, about 3400 ppm or less, about 3300 ppm or less, about 3200 ppm or less, or about 3100 ppm or less. Thus, the nonionic polymer can be present in the polishing composition at a concentration bounded by any two of the aforementioned endpoints. For example, the nonionic polymer can be present in the polishing composition at a concentration of about 1 ppm to about 5000 ppm, about 5 ppm to about 4900 ppm, about 10 ppm to about 4800 ppm, about 20 ppm to about 4700 ppm, about 30 ppm to about 4600 ppm, about 40 ppm to about 4700 ppm, about 50 ppm to about 4600 ppm, about 75 ppm to about 4500 ppm, about 100 ppm to about 4400 ppm, about 125 ppm to about 4300 ppm, about 150 ppm to about 4200 ppm, about 175 ppm to about 4100 ppm, about 200 ppm to about 4000 ppm, about 250 ppm to about 3900 ppm, about 300 ppm to about 3800 ppm, about 350 ppm to about 3700 ppm, about 400 ppm to about 3600 ppm, about 450 ppm to about 3500 ppm, about 500 ppm to about 3400 ppm, about 550 ppm to about 3300 ppm, about 600 ppm to about 3200 ppm, about 650 ppm to about 3100 ppm, about 700 ppm to about 3000 ppm, about 750 ppm to about 2750 ppm, about 800 ppm to about 2500 ppm, about 850 ppm to about 2250 ppm, about 900 ppm to about 2000 ppm, about 1000 ppm to about 1750 ppm, or about 1250 ppm to about 1500 ppm.

In an embodiment, the nonionic polymer is present in the polishing composition at a concentration of about 1 ppm to about 2000 ppm. In another embodiment, the nonionic polymer is present in the polishing composition at a concentration of about 50 ppm to about 1200 ppm.

The polishing composition comprises a saturated monoacid. Without wishing to be bound to any particular theory, it is believed that the saturated monoacid acts as a rate accelerator during substrate polishing to maintain suitable removal rates. For example, increasing the concentration of a dishing control agent (e.g., cationic polymer) during polishing, while improving dishing performance, typically lowers the oxide removal rate.

In an embodiment, the saturated monoacid comprises formic acid, acetic acid, propanoic acid, butanoic acid, pentanoic acid, hexanoic acid, or a combination thereof. In another embodiment, the saturated monoacid comprises acetic acid.

The polishing composition can comprise any suitable concentration of saturated monoacid. The saturated monoacid can be present in the polishing composition at a concentration of about 1 ppm or more, for example, about 5 ppm or more, about 10 ppm or more, about 20 ppm or more, about 30 ppm or more, about 40 ppm or more, about 50 ppm or more, about 75 ppm or more, about 100 ppm or more, about 125 ppm or more, about 150 ppm or more, about 175 ppm or more, about 200 ppm or more, about 250 ppm or more, about 300 ppm or more, about 350 ppm or more, about 400 ppm or more, about 450 ppm or more, about 500 ppm or more, about 550 ppm or more, about 600 ppm or more, about 650 ppm or more, about 700 ppm or more, about 750 ppm or more, about 800 ppm or more, about 850 ppm or more, about 900 ppm or more, about 950 ppm or more, about 1000 ppm or more, about 1250 ppm or more, about 1500 ppm or more, about 1750 ppm or more, about 2000 ppm or more, about 2250 ppm or more, about 2500 ppm or more, about 2750 ppm or more, or about 3000 ppm or more. Alternatively, or in addition, the saturated monoacid can be present in the polishing composition at a concentration of about 5000 ppm or less, for example, about 4900 ppm or less, about 4800 ppm or less, about 4700 ppm or less, about 4600 ppm or less, about 4500 ppm or less, about 4400 ppm or less, about 4300 ppm or less, about 4200 ppm or less, about 4100 ppm or less, about 4000 ppm or less, about 3900 ppm or less, about 3800 ppm or less, about 3700 ppm or less, about 3600 ppm or less, about 3500 ppm or less, about 3400 ppm or less, about 3300 ppm or less, about 3200 ppm or less, or about 3100 ppm or less. Thus, the saturated monoacid can be present in the polishing composition at a concentration bounded by any two of the aforementioned endpoints. For example, the saturated monoacid can be present in the polishing composition at a concentration of about 1 ppm to about 5000 ppm, about 5 ppm to about 4900 ppm, about 10 ppm to about 4800 ppm, about 20 ppm to about 4700 ppm, about 30 ppm to about 4600 ppm, about 40 ppm to about 4700 ppm, about 50 ppm to about 4600 ppm, about 75 ppm to about 4500 ppm, about 100 ppm to about 4400 ppm, about 125 ppm to about 4300 ppm, about 150 ppm to about 4200 ppm, about 175 ppm to about 4100 ppm, about 200 ppm to about 4000 ppm, about 250 ppm to about 3900 ppm, about 300 ppm to about 3800 ppm, about 350 ppm to about 3700 ppm, about 400 ppm to about 3600 ppm, about 450 ppm to about 3500 ppm, about 500 ppm to about 3400 ppm, about 550 ppm to about 3300 ppm, about 600 ppm to about 3200 ppm, about 650 ppm to about 3100 ppm, about 700 ppm to about 3000 ppm, about 750 ppm to about 2750 ppm, about 800 ppm to about 2500 ppm, about 850 ppm to about 2250 ppm, about 900 ppm to about 2000 ppm, about 1000 ppm to about 1750 ppm, or about 1250 ppm to about 1500 ppm.

In an embodiment, the saturated monoacid is present in the polishing composition at a concentration of about 1 ppm to about 3600 ppm. In another embodiment, the saturated monoacid is present in the polishing composition at a concentration of about 100 ppm to about 900 ppm.

In some embodiments, the inventive polishing composition further comprises an unsaturated monoacid. Applicants have surprisingly discovered that the unsaturated monoacid acts as a silicon nitride stop agent and also acts as dishing control agent to increase SiN selectivity.

In an embodiment, the unsaturated monoacid comprises a $C_3$-$C_6$ unsaturated monoacid. As an example, the $C_3$-$C_6$ unsaturated monoacid can comprise acrylic acid, 2-butenoic acid, 2-pentenoic acid, trans-2-hexenoic acid, trans-3-hexenoic acid, 2-hexynoic acid, 2,4-hexadienoic acid, potassium sorbate, trans-2-methyl-2-butenoic acid, 3,3-dimethylacrylic acid, or a combination thereof, including stereoisomers thereof.

In another embodiment, the $C_3$-$C_6$ unsaturated monoacid comprises 2-butenoic acid (i.e., crotonic acid or trans-2-butenoic acid).

The polishing composition can comprise any suitable concentration of unsaturated monoacid. The unsaturated monoacid can be present in the polishing composition at a concentration of about 1 ppm or more, for example, about 5 ppm or more, about 10 ppm or more, about 20 ppm or more, about 30 ppm or more, about 40 ppm or more, about 50 ppm or more, about 75 ppm or more, about 100 ppm or more, about 125 ppm or more, about 150 ppm or more, about 175 ppm or more, about 200 ppm or more, about 250 ppm or more, about 300 ppm or more, about 350 ppm or more, about 400 ppm or more, about 450 ppm or more, about 500 ppm or more, about 550 ppm or more, about 600 ppm or more, about 650 ppm or more, about 700 ppm or more, about 750 ppm or more, about 800 ppm or more, about 850 ppm or more, about 900 ppm or more, about 950 ppm or more, about 1000 ppm or more, about 1250 ppm or more, about 1500 ppm or more, about 1750 ppm or more, about 2000 ppm or more, about 2250 ppm or more, about 2500 ppm or more, about 2750 ppm or more, or about 3000 ppm or more. Alternatively, or in addition, the unsaturated monoacid can be present in the polishing composition at a concentration of about 5000 ppm or less, for example, about 4900 ppm or less, about 4800 ppm or less, about 4700 ppm or less, about 4600 ppm or less, about 4500 ppm or less, about 4400 ppm or less, about 4300 ppm or less, about 4200 ppm or less, about 4100 ppm or less, about 4000 ppm or less, about 3900 ppm or less, about 3800 ppm or less, about 3700 ppm or less, about 3600 ppm or less, about 3500 ppm or less, about 3400 ppm or less, about 3300 ppm or less, about 3200 ppm or less, or about 3100 ppm or less. Thus, the unsaturated monoacid can be present in the polishing composition at a concentration bounded by any two of the aforementioned endpoints. For example, the unsaturated monoacid can be present in the polishing composition at a concentration of about 1 ppm to about 5000 ppm, e.g., about 5 ppm to about 4900 ppm, about 10 ppm to about 4800 ppm, about 20 ppm to about 4700 ppm, about 30 ppm to about 4600 ppm, about 40 ppm to about 4700 ppm, about 50 ppm to about 4600 ppm, about 75 ppm to about 4500 ppm, about 100 ppm to about 4400 ppm, about 125 ppm to about 4300 ppm, about 150 ppm to about 4200 ppm, about 175 ppm to about 4100 ppm, about 200 ppm to about 4000 ppm, about 250 ppm to about 3900 ppm, about 300 ppm to about 3800 ppm, about 350 ppm to about 3700 ppm, about 400 ppm to about 3600 ppm, about 450 ppm to about 3500 ppm, about 500 ppm to about 3400 ppm, about 550 ppm to about 3300 ppm, about 600 ppm to about 3200 ppm, about 650 ppm to about 3100 ppm, about 700 ppm to about 3000 ppm, about 750 ppm to about 2750 ppm, about 800 ppm to about 2500 ppm, about 850 ppm to about 2250 ppm, about 900 ppm to about 2000 ppm, about 1000 ppm to about 1750 ppm, or about 1250 ppm to about 1500 ppm.

In an embodiment, the unsaturated monoacid is present in the polishing composition at a concentration of about 1 ppm to about 1500 ppm. In another embodiment, the unsaturated monoacid is present in the polishing composition at a concentration of about 250 ppm to about 1000 ppm.

The polishing composition comprises an aqueous carrier. The aqueous carrier comprises water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

In some embodiments, the polishing composition further comprises an additive.

In an embodiment, the additive, when present, is selected from biocides, scale inhibitors, dispersants, rate enhancers, and a combination thereof. In accordance with embodiments of the invention, the polishing composition can comprise more than one additive (e.g., two or more additives, three or more additives, four of more additives, etc.).

A biocide, when present, can be any suitable biocide and can be present in the polishing composition at any suitable concentration. A suitable biocide is an isothiazolinone biocide. The biocide can be present in the polishing composition at a concentration of about 1 ppm to about 750 ppm, preferably about 100 ppm to about 200 ppm.

The polishing composition can have any suitable pH. The polishing composition can comprise one or more compounds capable of adjusting (i.e., that adjust) the pH of the polishing composition (i.e., pH adjustors). The pH of the polishing composition can be adjusted using any suitable compound capable of adjusting the pH of the polishing composition. The pH adjustor desirably is water-soluble and compatible with the other components of the polishing composition. Typically, the polishing composition has a pH of about 4 to about 7 at the point-of-use.

In an embodiment, the pH of the polishing composition is about 3.0 to about 5.0 (e.g., about 3.5, about 4, and/or about 4.5).

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., ceria abrasive particles, cationic polymer, nonionic polymer, saturated monoacid, optional unsaturated monoacid, optional pH adjustor, and/or any optional additive) as well as any combination of ingredients (e.g., ceria abrasive particles, cationic polymer, nonionic polymer, saturated monoacid, optional unsaturated monoacid, optional pH adjustor, and/or any optional additive, etc.).

For example, the polishing composition can be prepared by (i) providing all or a portion of the aqueous carrier, (ii) dispersing the ceria abrasive particles, cationic polymer, nonionic polymer, saturated monoacid, optional unsaturated monoacid, optional pH adjustor, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., aqueous carrier, cationic polymer, nonionic polymer, saturated monoacid, optional unsaturated monoacid, optional pH adjustor, and/or any optional additive) in a cerium oxide slurry, (ii) providing one or more components in an additive solution (e.g., aqueous carrier, cationic polymer, nonionic polymer, a saturated monoacid, an optional unsaturated monoacid, optional pH adjustor, and/or any optional additive), (iii) combining the cerium oxide slurry and the additive solution to form a mixture, (iv) optionally adding suitable amounts of any other optional additives to the mixture, and (v) adjusting the pH of the mixture as appropriate.

The polishing composition can be supplied as a one-package system comprising ceria abrasive particles, cationic polymer, nonionic polymer, a saturated monoacid, an optional unsaturated monoacid, optional pH adjustor, and/or any optional additive, and aqueous carrier. Alternatively, the polishing composition of the invention is supplied as a two-package system comprising a cerium oxide slurry in a first package and an additive solution in a second package, wherein the ceria oxide slurry consists essentially of, or consists of, ceria abrasive particles, cationic polymer, optional pH adjustor, and/or any optional additive, and aqueous carrier, and wherein the additive solution consists essentially of, or consists of, nonionic polymer, saturated monoacid, optional unsaturated monoacid, optional pH adjustor, and/or any optional additive. The two-package system allows for the adjustment of substrate global flattening characteristics and polishing speed by changing the blending ratio of the two packages, i.e., the cerium oxide slurry and the additive solution.

Various methods can be employed to utilize such a two-package polishing system (e.g., A-pack and B-pack). For example, the cerium oxide slurry and additive solution can be delivered to the polishing table by different pipes that are joined and connected at the outlet of supply piping. The cerium oxide slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 seconds (s) or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 minutes (m) of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the ceria abrasive particles, cationic polymer, nonionic polymer, saturated monoacid, optional pH adjustor, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the cationic polymer, nonionic polymer, saturated monoacid, optional unsaturated monoacid, optional pH adjustor, and/or any optional additive are at least partially or fully dissolved in the concentrate. Desirably, the inventive polishing composition is colloidally stable when in the form of a concentrate that is 4 times more concentrated than the polishing composition at the point-of-use.

The invention provides a method of chemically-mechanically polishing a substrate comprising (i) providing a substrate comprising a dielectric layer on a surface of the substrate; (ii) providing a polishing pad; (iii) providing a chemical-mechanical polishing composition comprising: (a) ceria abrasive particles, (b) a cationic polymer, (c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof, (d) a saturated monoacid, and (e) an aqueous carrier; (iv) contacting the substrate with the polishing pad and the chemical-mechanical polishing composition; and (v) moving the polishing pad and the chemical-mechanical polishing composition relative to the substrate to abrade at least a portion of the dielectric layer on a surface of the substrate.

The polishing composition can be used to polish any suitable substrate and is especially useful for polishing substrates comprising at least one layer (typically a surface layer) comprised of a dielectric material. Suitable substrates include wafers used in the semiconductor industry. The wafers typically comprise or consist of, for example, a metal, metal oxide, metal nitride, metal composite, metal alloy, a low dielectric material, or a combination thereof. The method of the invention is particularly useful for polishing substrates comprising silicon oxide, silicon nitride, and/or polysilicon, e.g., any one, two, or especially all three of the aforementioned materials.

In some embodiments, the substrate comprising a dielectric layer (e.g., silicon oxide) further comprises a silicon nitride layer.

In certain embodiments, the substrate comprises polysilicon in combination with silicon oxide and/or silicon nitride. The polysilicon can be any suitable polysilicon, many of which are known in the art. The polysilicon can have any suitable phase and can be amorphous, crystalline, or a combination thereof.

In an embodiment, the dielectric layer comprises silicon oxide. The silicon oxide similarly can be any suitable silicon oxide, many of which are known in the art. Suitable types of silicon oxide include, but are not limited to, borophosphosilicate glass (BPSG), plasma-enhanced tetraethyl orthosilicate (PETEOS), thermal oxide, undoped silicate glass, and high density plasma (HDP) oxide.

The polishing composition of the invention desirably exhibits a high removal rate when polishing a substrate comprising silicon oxide according to a method of the invention. For example, when polishing silicon wafers comprising silicon oxide in accordance with an embodiment of the invention, such as HDP oxides and/PETEOS and/or tetraethyl orthosilicate (TEOS), the polishing composition desirably exhibits a removal rate of the silicon oxide of about 500 Å/min or higher, e.g., about 550 Å/min or higher, about 600 Å/min or higher, about 650 Å/min or higher, about 700 Å/min or higher, about 750 Å/min or higher, about 800 Å/min or higher, about 850 Å/min or higher, about 900 Å/min or higher, about 950 Å/min or higher, about 1000 Å/min or higher, about 1100 Å/min or higher, about 1200 Å/min or higher, about 1300 Å/min or higher, about 1400 Å/min or higher, about 1500 Å/min or higher, about 1600 Å/min or higher, about 1700 Å/min or higher, about 1800 Å/min or higher, about 1900 Å/min or higher, about 2000 Å/min or higher, about 2100 Å/min or higher, about 2200 Å/min or higher, about 2300 Å/min or higher, about 2400

Å/min or higher, about 2500 Å/min or higher, about 2600 Å/min or higher, about 2700 Å/min or higher, about 2800 Å/min or higher, about 2900 Å/min or higher, about 3000 Å/min or higher, about 3100 Å/min or higher, about 3200 Å/min or higher, about 3300 Å/min or higher, about 3400 Å/min or higher, about 3500 Å/min or higher, about 3600 Å/min or higher, about 3700 Å/min or higher, about 3800 Å/min or higher, about 3900 Å/min or higher, about 4000 Å/min or higher, about 4100 Å/min or higher, about 4200 Å/min or higher, about 4300 Å/min or higher, about 4400 Å/min or higher, about 4500 Å/min or higher, about 4600 Å/min or higher, about 4700 Å/min or higher, about 4800 Å/min or higher, about 4900 Å/min or higher, or about 5000 Å/min or higher.

The polishing composition of the invention desirably exhibits a low removal rate when polishing a substrate comprising silicon nitride according to a method of the invention. For example, when polishing silicon wafers comprising silicon nitride in accordance with an embodiment of the invention, the polishing composition desirably exhibits a silicon nitride removal rate of about 500 Å/min or lower, e.g., 400 Å/min or lower, about 300 Å/min or lower, about 200 Å/min or lower, about 100 Å/min or lower, about 90 Å/min or lower, about 80 Å/min or lower, about 70 Å/min or lower, about 60 Å/min or lower, or about 50 Å/min or lower, about 40 Å/min or lower, about 30 Å/min or lower, about 20 Å/min or lower, about 10 Å/min or lower, about 5 Å/min or lower, about 3 Å/min or lower, or about 1 Å/min or lower. In some embodiments, the polishing composition exhibits a silicon nitride removal rate that is too low to be detected.

The chemical-mechanical polishing composition of the invention can be tailored to provide effective polishing at the desired polishing ranges selective to specific thin layer materials, while at the same time minimizing surface imperfections, defects, corrosion, erosion, and the removal of stop layers. Without wishing to be bound to any particular theory, it is believed that the suitable defect performance is due, at least in part, to the reduced adhesion of the ceria abrasive particles to the polishing pad. The reduced ceria abrasive particle adhesion to the polishing pad also allows for higher downforce during polishing (e.g., 4 pounds per square inch (psi)). In addition, the selectivity can be controlled, to some extent, by altering the relative concentrations of the components of the polishing composition. When desirable, the chemical-mechanical polishing composition of the invention can be used to polish a substrate with a ratio of the silicon oxide removal rate to the silicon nitride removal rate (i.e., selectivity) of about 5:1 or higher (e.g., about 10:1 or higher, about 15:1 or higher, about 25:1 or higher, about 50:1 or higher, about 100:1 or higher, about 150:1 or higher, about 200:1 or higher, about 250:1 or higher, about 300:1 or higher, about 350:1 or higher, about 400:1 or higher, about 450:1 or higher, or about 500:1 or higher).

The polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW 1, SPM3100 (commercially available from, for example, Eminess Technologies), POLITEX™, NEXPLANAR® E6088 (Cabot Microelectronics, Aurora, Ill.), and Fujibo POLYPAS™ 27. A preferred polishing pad is the EPIC™ D100 pad commercially available from Cabot Microelectronics. Another preferred polishing pad is the NEXPLANAR® E6088 pad.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

Embodiments (1) In embodiment (1) is presented a chemical-mechanical polishing composition comprising (a) ceria abrasive particles, (b) a cationic polymer, (c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof, (d) a saturated monoacid, and (e) an aqueous carrier.

(2) In embodiment (2) is presented the polishing composition of embodiment (1), wherein the ceria abrasive particles comprise calcined ceria particles, wet ceria particles, wet-based processed ceria particles, or a combination thereof.

(3) In embodiment (3) is presented the polishing composition of embodiment (1) or (2), wherein the ceria abrasive particles are present in the polishing composition at a concentration of about 0.0005 wt. % to about 10 wt. %.

(4) In embodiment (4) is presented the polishing composition of any one of embodiments (1)-(3), wherein the cationic polymer comprises poly(diallyldimethylammonium chloride)-co-poly(acrylamide), poly(2-dimethylamino)ethyl methacrylate) methyl chloride quaternary salt, poly(diallyldimethylammonium chloride), polyvinylmethyl imidazolium methyl sulfate, poly(dimethylamine-co-epichlorohydrin), poly(vinylmethyl imidazolium methyl sulfate)-co-poly(vinylpyrrolidone), poly(vinylmethyl imidazolium chloride)-co-poly(N-vinylpyrrolidone), poly(vinylpyrrolidone)-co-poly(methacrylamide)-co-poly(vinylimidazole)-co-poly(vinylmethyl imidazolium methyl sulfate), poly(vinylpyrrolidone)-co-poly(dimethylaminoethyl methacrylate methyl sulfate), poly(vinylcaprolactam)-co-poly(vinylpyrrolidone)-co-poly(vinylmethyl imidazolium methyl sulfate), or a combination thereof.

(5) In embodiment (5) is presented the polishing composition of any one of embodiments (1)-(4), wherein the cationic polymer is present in the polishing composition at a concentration of about 0.0005 wt. % to about 0.025 wt. %.

(6) In embodiment (6) is presented the polishing composition of any one of embodiments (1)-(5), wherein the nonionic polymer is present in the polishing composition at a concentration of about 0.0005 wt. % to about 0.5 wt. %.

(7) In embodiment (7) is presented the polishing composition of any one of embodiments (1)-(6), wherein the saturated monoacid comprises formic acid, acetic acid, propanoic acid, butanoicz acid, pentanoic acid, hexanoic acid, or a combination thereof.

(8) In embodiment (8) is presented the polishing composition of any one of embodiments (1)-(7), wherein the saturated monoacid is present in the polishing composition at a concentration of about 0.0001 wt. % to about 0.5 wt. %.

(9) In embodiment (9) is presented the polishing composition of any one of embodiments (1)-(8), further comprising an additive selected from biocides, scale inhibitors, dispersants, pH adjustors, and a combination thereof.

(10) In embodiment (10) is presented the polishing composition of any one of embodiments (1)-(9), wherein the pH of the polishing composition is about 3.0 to about 5.0.

(11) In embodiment (11) is presented the polishing composition of any one of embodiments (1)-(10) further comprising an unsaturated monoacid.

(12) In embodiment (12) is presented the polishing composition of embodiment (11), wherein the unsaturated monoacid comprises a $C_3$-$C_6$ unsaturated monoacid.

(13) In embodiment (13) is presented the polishing composition of embodiment (12), wherein the $C_3$-$C_6$ unsaturated mono acid comprises acrylic acid, 2-butenoic acid, 2-pentenoic acid, trans-2-hexenoic acid, trans-3-hexenoic acid, 2-hexynoic acid, 2,4-hexadienoic acid, potassium sorbate, trans-2-methyl-2-butenoic acid, 3,3-dimethylacrylic acid, or a combination thereof, including stereoisomers thereof.

(14) In embodiment (14) is presented the polishing composition of embodiment (13), wherein the $C_3$-$C_6$ unsaturated monoacid comprises 2-butenoic acid.

(15) In embodiment (15) is presented the polishing composition of any one of embodiments (11)-(14), wherein the unsaturated monoacid is present in the polishing composition at a concentration of about 0.0001 wt. % to about 0.5 wt. %.

(16) In embodiment (16) is presented a method of chemically-mechanically polishing a substrate comprising (i) providing a substrate comprising a dielectric layer on a surface of the substrate; (ii) providing a polishing pad; (iii) providing a chemical-mechanical polishing composition comprising: (a) ceria abrasive particles, (b) a cationic polymer, (c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof, (d) a saturated monoacid, and (e) an aqueous carrier; (iv) contacting the substrate with the polishing pad and the chemical-mechanical polishing composition; and (v) moving the polishing pad and the chemical-mechanical polishing composition relative to the substrate to abrade at least a portion of the dielectric layer on a surface of the substrate.

(17) In embodiment (17) is presented the method of embodiment (16), wherein the ceria abrasive particles comprise calcined ceria particles, wet ceria particles, wet-based processed ceria particles, or a combination thereof.

(18) In embodiment (18) is presented the method of embodiment (16) or (17), wherein the ceria abrasive particles are present in the polishing composition at a concentration of about 0.0005 wt. % to about 10 wt. %.

(19) In embodiment (19) is presented the method of any one of embodiments (16)-(18), wherein the cationic polymer comprises poly(diallyldimethylammonium chloride)-co-poly(acrylamide), poly(2-dimethylamino)ethyl methacrylate) methyl chloride quaternary salt, poly(diallyldimethylammonium chloride), polyvinylmethyl imidazolium methyl sulfate, poly(dimethylamine-co-epichlorohydrin), poly(vinylmethyl imidazolium methyl sulfate)-co-poly(vinylpyrrolidone), poly(vinylmethyl imidazolium chloride)-co-poly(N-vinylpyrrolidone), poly(vinylpyrrolidone)-co-poly(methacrylamide)-co-poly(vinylimidazole)-co-poly(vinylmethyl imidazolium methyl sulfate), poly(vinylpyrrolidone)-co-poly(dimethylaminoethyl methacrylate methyl sulfate), poly(vinylcaprolactam)-co-poly(vinylpyrrolidone)-co-poly(vinylmethyl imidazolium methyl sulfate), or a combination thereof.

(20) In embodiment (20) is presented the method of any one of embodiments (16)-(19), wherein the cationic polymer is present in the polishing composition at a concentration of about 0.0005 wt. % to about 0.025 wt. %.

(21) In embodiment (21) is presented the method of any one of embodiments (16)-(20), wherein the nonionic polymer is present in the polishing composition at a concentration of about 0.0005 wt. % to about 0.5 wt. %.

(22) In embodiment (22) is presented the method of any one of embodiments (16)-(21), wherein the saturated monoacid comprises formic acid, acetic acid, propanoic acid, butanoic acid, pentanoic acid, hexanoic acid, or a combination thereof.

(23) In embodiment (23) is presented the method of any one of embodiments (16)-(22), wherein the saturated monoacid is present in the polishing composition at a concentration of about 0.0001 wt. % to about 0.5 wt. %.

(24) In embodiment (24) is presented the method of any one of embodiments (16)-23) further comprising an additive selected from biocides, scale inhibitors, dispersants, pH adjustors, and a combination thereof.

(25) In embodiment (25) is presented the method of any one of embodiments (16)-(24), wherein the pH of the polishing composition is about 3.0 to about 5.0.

(26) In embodiment (26) is presented the method of any one of embodiments (16)-(25), wherein the polishing composition further comprises an unsaturated monoacid.

(27) In embodiment (27) is presented the method of embodiment (26), wherein the unsaturated monoacid comprises a $C_3$-$C_6$ unsaturated monoacid.

(28) In embodiment (28) is presented the method of embodiment (27), wherein the $C_3$-$C_6$ unsaturated mono acid comprises acrylic acid, 2-butenoic acid, 2-pentenoic acid, trans-2-hexenoic acid, trans-3-hexenoic acid, 2-hexynoic acid, 2,4-hexadienoic acid, potassium sorbate, trans-2-methyl-2-butenoic acid, 3,3-dimethylacrylic acid, or a combination thereof, including stereoisomers thereof.

(29) In embodiment (29) is presented the method of embodiment (28), wherein the $C_3$-$C_6$ unsaturated monoacid comprises 2-butenoic acid.

(30) In embodiment (30) is presented the method of any one of embodiments (26)-(29), wherein the unsaturated monoacid is present in the polishing composition at a concentration of about 0.0001 wt. % to about 0.5 wt. %.

(31) In embodiment (31) is presented the method of any one of embodiments (16)-(30), wherein the dielectric layer comprises silicon oxide.

(32) In embodiment (32) is presented the method of any one of embodiments (16)-(31), wherein the substrate further comprises a silicon nitride (SiN) layer on a surface of the substrate.

(33) In embodiment (33) is presented the method of embodiment (32), wherein at least a portion of the dielectric layer comprising silicon oxide and at least a portion of the silicon nitride layer are abraded to polish the substrate.

(34) In embodiment (34) is presented the method of embodiment (33), wherein the abrasion of the dielectric layer comprising silicon oxide provides a silicon oxide removal rate, wherein the abrasion of the silicon nitride layer provides a silicon nitride removal rate, and wherein the ratio of the silicon oxide removal rate to the silicon nitride removal rate is greater than about 15 to 1.

(35) In embodiment (35) is presented the method of any one of embodiment (34), wherein the ratio of the silicon oxide removal rate to the silicon nitride removal rate is greater than about 350 to 1.

EXAMPLES

The following examples further illustrate the invention but, of course, should not be construed as in any way limiting its scope.

The following abbreviations are used throughout the Examples: removal rate (RR); tetraethyl orthosilicate-derived silicon oxide (TEOS); silicon nitride (SiN); removal rate (RR); molecular weight (MW); and polyethylene glycol (PEG).

In the following examples, substrates comprising a silicon oxide dielectric layer and a silicon nitride layer were polished using either a MIRRA™ (Applied Materials, Inc.) or a REFLEXION™ tool (Applied Materials, Inc.). Patterned wafers comprising 100 µm silicon nitride features on silicon oxide-coated substrates were obtained from Silyb Inc. An IC1010™ polishing pad (Rohm and Haas Electronic Materials) or NEXPLANAR® E6088 polishing pad (Cabot Microelectronics, Aurora, Ill.) was used for all compositions. Removal rates were calculated by measuring the film thickness, using spectroscopic elipsometry, and subtracting the final thickness from the initial thickness.

For all MIRRA™ (200 mm) experiments, polishing compositions were flowed at 105 mL/min for A-pack (containing ceria particles) and 45 mL/min for B-pack, or flowed in at 150 mL/min, and were premixed in a 7:3 mixing ratio (A-pack to B-pack). The tool conditions were typically with a down force of about 13 kPa to about 21 kPa (e.g., about 2-3 psi); 100 rpm platen speed; 85 rpm head speed; hard pad with a median aggressive conditioner (e.g., SAESOL™-C7).

For all REFLEXION™ (300 mm) experiments, polishing compositions were flowed at 175 mL/min for A-pack (containing ceria particles) and 75 mL/min for B-pack, or flowed in at 250 mL/min, and were premixed in a 7:3 mixing ratio (A-pack to B-pack). The tool conditions were typically with a down force of about 13 kPa to about 21 kPa (e.g., about 2-3 psi); 93 rpm head speed; 87 rpm platen speed; hard pad with a median aggressive conditioner.

Example 1

This example demonstrates the effectiveness of a chemical-mechanical polishing composition comprising ceria abrasive particles, a cationic polymer, a nonionic polymer comprising polyethylene glycol octadecyl ether, a saturated monoacid, and an aqueous carrier. This example also demonstrates a method of chemically-mechanically polishing a substrate in accordance with an embodiment of the present invention.

Separate substrates each comprising a dielectric layer on a surface of the substrate and a silicon nitride (SiN) layer on a surface of the substrate (0.18×0.18 µm pattern size) (Cell D Features) were polished with five different Polishing Compositions 1A-1E to evaluate the blanket polishing performance and the pattern polishing performance. The substrates were polished on a REFLEXION™ polishing tool having a 300 mm platen using either a IC1010™ pad or a NEXPLANAR™ E6088 pad.

Polishing Composition 1A (comparative) contained 0.29 wt. % ceria abrasive particles and 0.05 wt. % picolinic acid as a rate enhancer. Polishing Composition 1B (comparative) contained 0.2 wt. % ceria abrasive particles, 0.035 wt. % picolinic acid, and 0.0065 wt. % 3,5-dihydroxybenzoic acid as a conventional dishing control agent, 0.12 wt. % polyvinyl alcohol polymer as a conventional dishing control agent, and 0.00624 wt. % polyethylene glycol as a conventional profile control agent. Polishing Composition 1C (comparative) contained 0.2 wt. % ceria abrasive particles, 0.035 wt. % picolinic acid, 0.032 wt. % 1,3,5-trihydroxybenzene dihydrate as a conventional dishing control agent, 0.06 wt. % polyvinyl alcohol polymer as a conventional dishing control agent, 0.03 wt. % poly poly(ethylene glycol) bis (carboxymethyl) ether, and 0.002 wt. % CAPSTONE™ FS3100 (i.e., nonionic fluorosurfactant) as a conventional profile control agent.

Each of Polishing Compositions 1D (inventive) and 1E (inventive) contained 0.20 wt. % ceria abrasive p articles and 0.035 wt. % picolinic acid as a rate enhancer. Polishing Composition 1D contained 0.004 wt. % poly(2-dimethyl-amino)ethyl methacrylate) methyl chloride quaternary salt as a cationic polymer, 0.045 wt. % acetic acid as a saturated monoacid, and 0.02 wt. % polyethylene glycol octadecyl ether as a nonionic polymer. Polishing Composition 1E contained 0.003 wt. % poly(2-dimethylamino)ethyl methacrylate) methyl chloride quaternary salt as a cationic polymer, 0.045 wt. % acetic acid as a saturated monoacid, 0.02 wt. % polyethylene glycol octadecyl ether as a nonionic polymer, and 0.0768 wt. % crotonic acid as an unsaturated monoacid.

Each of Polishing Compositions 1A-1E also contained SAESOL™-C7 or SAESOL™-DS8051 as a conditioner. All polishing compositions also were adjusted to pH 4.0 with triethanolamine.

Following polishing, the blanket removal rates for TEOS and silicon nitride were determined. The dishing, erosion, and SiN loss performances were also calculated. The results are set forth in Table 1.

TABLE 1

Blanket and Pattern Performance

| Polishing Composition | Blanket Performance Removal Rate | | Pattern Performance (Cell-D features) | | |
|---|---|---|---|---|---|
| | TEOS (Å/min) | SiN (Å/min) | Dishing (Å) | Erosion (Å) | SiN Loss (Å) |
| 1A (comparative) | 8000 | 11 | 770 | 206 | 291 |
| 1B (comparative) | 3112 | 33 | 640 | 50 | 14 |
| 1C (comparative) | 2259 | 0 | 726 | 158 | 0 |

TABLE 1-continued

Blanket and Pattern Performance

| Polishing Composition | Blanket Performance Removal Rate | | Pattern Performance (Cell-D features) | | |
|---|---|---|---|---|---|
| | TEOS (Å/min) | SiN (Å/min) | Dishing (Å) | Erosion (Å) | SiN Loss (Å) |
| 1D (inventive) | 3211 | 25 | 281 | 118 | 23 |
| 1E (inventive) | 3009 | 10 | 137 | 38 | 0 |

As is apparent from the results set forth in Table 1, inventive Polishing Compositions 1D and 1E exhibited improved dishing, erosion, and SiN loss (lower numbers) while maintaining suitable TEOS removal rates and selectivity. Polishing Composition 1E comprising a small unsaturated monoacid further improves pattern performance without sacrificing blanket removal rate. For example, the SiN loss exhibited by Polishing Composition 1E was too low to be measured while maintaining a TEOS RR of higher than 3000 Å/min.

In addition, inventive Polishing Compositions 1D and 1E exhibited desirable selectivity between TEOS and SiN. For example, Polishing Composition 1D exhibited a ratio of silicon oxide removal rate to silicon nitride removal rate of about 128 to 1, and Polishing Composition 1E exhibited a ratio of silicon oxide removal rate to silicon nitride removal rate of about 300 to 1.

Example 2

This example demonstrates the effectiveness of a chemical-mechanical polishing composition comprising ceria abrasive particles, a cationic polymer, a nonionic polymer comprising polyethylene glycol octadecyl ether, a saturated monoacid, and an aqueous carrier. This example also demonstrates a method of chemically-mechanically polishing a substrate in accordance with an embodiment of the present invention.

Separate substrates each comprising a dielectric layer on a surface of the substrate and a silicon nitride (SiN) layer on a surface of the substrate (Cell D features) were polished with two different Polishing Compositions 2A and 2B to evaluate the blanket polishing performance and the pattern polishing performance. Each of the substrates was overpolished to an endpoint of approximately 1000 Å.

Polishing Composition 2A (comparative) contained 0.20 wt. % ceria abrasive particles and 0.0065 wt. % 3,5-dihydroxybenzoic acid as a conventional dishing control agent, 0.12 wt. % polyvinyl alcohol polymer as a conventional dishing control agent, and 0.00624 wt. % polyethylene glycol as a conventional profile control agent. Polishing Composition 2B (inventive) contained 0.20 wt. % ceria abrasive particles, 0.035 wt. % picolinic acid, 0.004 wt. % poly(2-dimethylamino)ethyl methacrylate) methyl chloride quaternary salt as a cationic polymer, 0.045 wt. % acetic acid as a saturated monoacid, and 0.020 wt. % polyethylene glycol octadecyl ether as a nonionic polymer.

Each of Polishing Compositions 2A and 2B also contained SAESOL™-DS8051 as a conditioner. Composition 2B also was adjusted to pH 4.0 with triethanolamine.

Following polishing, the blanket removal rates for TEOS and silicon nitride were determined. The dishing, erosion, and SiN loss performances were also calculated. The results are set forth in Table 2.

TABLE 2

Blanket and Pattern Performance

| Polishing Composition | Downforce (psi) | Blanket | | Pattern | | |
|---|---|---|---|---|---|---|
| | | TEOS RR (Å/min) | SiN RR (Å/min) | Dishing (Å) | Erosion (Å) | SiN Loss (Å) |
| 2A (comparative) | 1.5 | 3112 | 33 | 640 | 51 | 20 |
| 2B (inventive) | 2.0 | 3009 | 10 | 137 | 38 | <10 |
| | 2.5 | 3886 | 10 | 271 | 60 | <10 |
| | 3.0 | 4768 | 13 | 301 | 87 | 60 |

As is apparent from the results set forth in Table 2, inventive Polishing Composition 2B exhibited improved dishing, erosion, and SiN loss (lower numbers) while maintaining suitable TEOS removal rates and selectivity. Inventive Polishing Composition 2B exhibited a ratio of silicon oxide removal rate to silicon nitride removal rate of about 300:1 to about 367:1 and exhibited TEOS:SiN selectivity that was about three times greater than the selectivity of comparative Polishing Composition 2A. Moreover, the dishing exhibited by Polishing Composition 2B was approximately 2 to 4 times lower than that of comparative Polishing Composition 2A, and the SiN loss exhibited by Polishing Composition 2B was as much as 50% less at the lower downforce pressures than that exhibited by comparative Polishing Composition 2A.

Example 3

This example demonstrates the effectiveness of a chemical-mechanical polishing composition comprising ceria abrasive particles, a cationic polymer, a nonionic polymer comprising polyethylene glycol octadecyl ether, a saturated monoacid, and an aqueous carrier. This example also demonstrates a method of chemically-mechanically polishing a substrate in accordance with an embodiment of the present invention.

Separate substrates each comprising a dielectric layer on a surface of the substrate and a silicon nitride (SiN) layer on a surface of the substrate (Cell D features) were polished with four different Polishing Compositions 3A-3D to evaluate the blanket polishing performance and the pattern polishing performance.

Polishing Composition 3A (comparative) contained 0.2 wt. % ceria abrasive particles and 0.035 wt. % picolinic acid, 0.032 wt. % 1,3,5-trihydroxybenzene dihydrate as a conventional dishing control agent, 0.20 wt. % polyvinyl alcohol polymer as a conventional dishing control agent, 0.03 wt. % poly(ethylene glycol) bis(carboxymethyl) ether and 0.002 wt. % Capstone™ FS3100 as a conventional profile control agent. Polishing Composition 3B (comparative) contained 0.20 wt. % ceria abrasive particles and 0.0065 wt. % 3,5-dihydroxybenzoic acid as a conventional dishing control agent, 0.12 wt. % polyvinyl alcohol polymer as a conventional dishing control agent, and 0.0062 wt. % polyethylene glycol as a conventional profile control agent.

Polishing Composition 3C (inventive) contained 0.2 wt. % ceria abrasive particles, 0.004 wt. % poly(2-dimethylamino)ethyl methacrylate) methyl chloride quaternary salt as a cationic polymer, 0.045 wt. % acetic acid as a saturated monoacid, and 0.02 wt. % polyethylene glycol octadecyl ether as a nonionic polymer. Polishing Composition 3D (inventive) contained 0.20 wt. % ceria abrasive particles, 0.004 wt. % poly(2-dimethylamino)ethyl methacrylate) methyl chloride quaternary salt as a cationic polymer, 0.045 wt. % acetic acid as a saturated monoacid, 0.02 wt. % polyethylene glycol octadecyl ether as a nonionic polymer, and 0.0768 wt. % crotonic acid as an unsaturated monoacid.

Each of Polishing Compositions 3A-3D also contained SAESOL™-DS8051 as a conditioner. All polishing compositions also were adjusted to pH 4.0 with triethanolamine.

Following polishing, the blanket removal rates for TEOS and silicon nitride were determined. The dishing, erosion, and SiN loss performances were also calculated. The results are set forth in Table 3.

TABLE 3

Blanket and Pattern Performance

| Polishing Composition | Downforce (psi) | Blanket | | | Pattern | | |
| --- | --- | --- | --- | --- | --- | --- | --- |
| | | TEOS RR (Å/min) | SiN RR (Å/min) | Selectivity | Dishing (Å) | Erosion (Å) | SiN Loss (Å) |
| 3A (comparative) | 1.5 | 2000 | 4 | 500 | 726 | 158 | * |
| 3B (comparative) | 1.5 | 3112 | 33 | 94 | 640 | 51 | 20 |
| 3C (inventive) | 2.0 | 3211 | 25 | 128 | 222 | 90 | 26 |
| 3D (inventive) | 2.0 | 3009 | 10 | 317 | 99 | 38 | * |

* SiN loss was below detection

As is apparent from the results set forth in Table 3, inventive Polishing Compositions 3C and 3D exhibited improved dishing, erosion, and SiN loss (lower numbers) while maintaining suitable TEOS removal rates and selectivity. Inventive Polishing Compositions 3C and 3D exhibited a ratio of silicon oxide removal rate to silicon nitride removal rate of about 125:1 to greater than about 310:1 and exhibited TEOS:SiN selectivity that was about three times greater than the selectivity of comparative Polishing Composition 3B. Moreover, the dishing exhibited by Polishing Compositions 3C and 3D was approximately 3 to 7 times lower than that of comparative Polishing Compositions 3A and 3B, and the SiN loss exhibited by Polishing Composition 3D was too low to be detected while exhibiting a suitable TEOS removal rate and selectivity.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) ceria abrasive particles,
   (b) a cationic polymer, wherein the cationic polymer comprises poly(diallyldimethylammonium chloride)-co-poly(acrylamide), poly(2-dimethylamino)ethyl methacrylate) methyl chloride quaternary salt, polyvinylmethyl imidazolium methyl sulfate, poly(dimethylamine-co-epichlorohydrin), poly(vinylmethyl imidazolium methyl sulfate)-co-poly(vinylpyrrolidone), poly (vinylmethyl imidazolium chloride)-co-poly(N-vinylpyrrolidone), poly(vinylpyrrolidone)-co-poly (methacrylamide)-co-poly(vinylimidazole)-co-poly (vinylmethyl imidazolium methyl sulfate), poly (vinylpyrrolidone)-co-poly(dimethylaminoethyl methacrylate methyl sulfate), poly(vinylcaprolactam)-co-poly(vinylpyrrolidone)-co-poly(vinylmethyl imidazolium methyl sulfate), or a combination thereof,
(c) a nonionic polymer comprising polyethylene glycol octadecyl ether, polyethylene glycol lauryl ether, polyethylene glycol oleyl ether, poly(ethylene)-co-poly(ethylene glycol), octylphenoxy poly(ethyleneoxy)ethanol, or a combination thereof,
(d) a saturated monoacid, and
(e) an aqueous carrier.

2. The polishing composition of claim 1, wherein the ceria abrasive particles comprise calcined ceria particles, wet ceria particles, wet-based processed ceria particles, or a combination thereof.

3. The polishing composition of claim 1, wherein the ceria abrasive particles are present in the polishing composition at a concentration of about 0.0005 wt. % to about 10 wt. %.

4. The polishing composition of claim 1, wherein the cationic polymer is present in the polishing composition at a concentration of about 0.0005 wt. % to about 0.025 wt. %.

5. The polishing composition of claim 1, wherein the nonionic polymer is present in the polishing composition at a concentration of about 0.0005 wt. % to about 0.5 wt. %.

6. The polishing composition of claim 1, wherein the saturated monoacid comprises formic acid, acetic acid, propanoic acid, butanoic acid, pentanoic acid, hexanoic acid, or a combination thereof.

7. The polishing composition of claim 1, wherein the saturated monoacid is present in the polishing composition at a concentration of about 0.0001 wt. % to about 0.5 wt. %.

8. The polishing composition of claim 1, further comprising an additive selected from biocides, scale inhibitors, dispersants, pH adjustors, and a combination thereof.

9. The polishing composition of claim 1, wherein the pH of the polishing composition is about 3.0 to about 5.0.

10. The polishing composition of claim 1, further comprising an unsaturated monoacid.

11. The polishing composition of claim 10, wherein the unsaturated monoacid comprises a $C_3$-$C_6$ unsaturated monoacid.

12. The polishing composition of claim 11, wherein the $C_3$-$C_6$ unsaturated mono acid comprises acrylic acid, 2-butenoic acid, 2-pentenoic acid, trans-2-hexenoic acid, trans-3-hexenoic acid, 2-hexynoic acid, 2,4-hexadienoic acid, potassium sorbate, trans-2-methyl-2-butenoic acid, 3,3-dimethylacrylic acid, or a combination thereof, including stereoisomers thereof.

13. The polishing composition of claim 12, wherein the $C_3$-$C_6$ unsaturated monoacid comprises 2-butenoic acid.

14. The polishing composition of claim 10, wherein the unsaturated monoacid is present in the polishing composition at a concentration of about 0.0001 wt. % to about 0.5 wt. %.

* * * * *